(12) United States Patent
Heo et al.

(10) Patent No.: US 11,658,651 B1
(45) Date of Patent: May 23, 2023

(54) RADIO FREQUENCY SWITCH CIRCUIT AND OPERATING METHOD THEREOF

(71) Applicant: SAMSUNG ELECTRO-MECHANICS CO., LTD., Suwon-si (KR)

(72) Inventors: Shinhaeng Heo, Suwon-si (KR); Byeonghak Jo, Suwon-si (KR); Wonsun Hwang, Suwon-si (KR); Hyunjin Yoo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/864,494

(22) Filed: Jul. 14, 2022

(30) Foreign Application Priority Data

Dec. 31, 2021 (KR) ........................ 10-2021-0194189

(51) Int. Cl.
*H04B 1/44* (2006.01)
*H03K 17/04* (2006.01)
*H04B 1/00* (2006.01)
*H04B 1/401* (2015.01)

(52) U.S. Cl.
CPC ............. *H03K 17/04* (2013.01); *H04B 1/006* (2013.01); *H04B 1/401* (2013.01); *H04B 1/44* (2013.01)

(58) Field of Classification Search
CPC ...... H04B 1/005; H04B 1/0053; H04B 1/006; H04B 1/40; H04B 1/44; H04B 1/48; H03K 17/04; H03K 17/041; H03K 17/04106; H03K 17/06; H03K 17/063; H03K 17/10; H03K 17/102; H03K 17/12; H03K 17/122; H03K 17/687; H03K 17/6871; H03K 17/6872; H03K 17/6874; H03K 17/693
See application file for complete search history.

(56) References Cited

U.S. PATENT DOCUMENTS

| | | |
|---|---|---|
| 6,294,950 B1 | 9/2001 | Lee et al. |
| 2010/0039166 A1 | 2/2010 | Choi |
| 2014/0176225 A1* | 6/2014 | Ha .......................... H03K 17/16 327/379 |
| 2018/0212601 A1* | 7/2018 | Yang .................... H03K 17/145 |
| 2020/0021276 A1 | 1/2020 | Jo et al. |

FOREIGN PATENT DOCUMENTS

| | | |
|---|---|---|
| KR | 10-0300077 B1 | 11/2001 |
| KR | 10-0930417 B1 | 12/2009 |
| KR | 10-2069633 B1 | 1/2020 |

* cited by examiner

*Primary Examiner* — Long Nguyen
(74) *Attorney, Agent, or Firm* — NSIP Law

(57) ABSTRACT

An RF switch circuit is provided. The RF switch circuit may include a first switch disposed between a transmitting port and an antenna port and including a plurality of first transistors; a second switch disposed between the antenna port and a receiving port and including a plurality of second transistors; and a switch control circuit configured to generate control voltages to control the first transistors and the second transistors, generate a first Off voltage to turn off at least one first transistor among the plurality of first transistors and the plurality of second transistors in a transmitting mode, and generate a second Off voltage to turn off at least one second transistor among the plurality of first transistors and the plurality of second transistors in a receiving mode, wherein the second Off voltage may be higher than the first Off voltage.

18 Claims, 9 Drawing Sheets

RADIO FREQUENCY SWITCH CIRCUIT AND OPERATING METHOD THEREOF

CROSS-REFERENCE TO RELATED APPLICATION

This application claims the benefit under 35 USC § 119(a) of Korean Patent Application No. 10-2021-0194189 filed on Dec. 31, 2021, in the Korean Intellectual Property Office, the entire disclosure of which is incorporated herein by reference.

BACKGROUND

1. Field

The following description relates to a radio frequency (RF) switch circuit and an operating method thereof.

2. Description of Related Art

A radio frequency (RF) switch circuit may frequently be used by a transmitter and a receiver of a communication device, and may transmit or block the RF signal. RF switch circuits are being implemented with a slim form factor, and the performance of RF switch circuits has improved.

In radio communication, a time division duplexing (TDD) scheme that selects a transmitting mode and a receiving mode may be performed through the RF switch circuit. The RF switch circuit must be fluently turned on and/or off based on the transmitting mode and the receiving mode, and linearity may be provided to signals with great power. Additionally, a faster switching operation of the RF switch may be desired.

The above information disclosed in this Background section is only for enhancement of understanding of the background of the invention, and therefore it may contain information that does not form the prior art that is already known in this country to a person of ordinary skill in the art.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a radio frequency (RF) switch circuit includes a first switch disposed between a transmitting port and an antenna port, and comprising a plurality of first transistors; a second switch disposed between the antenna port and a receiving port, and comprising a plurality of second transistors; and a switch control circuit configured to: generate control voltages to control the plurality of first transistors and the plurality of second transistors, generate a first Off voltage to turn off at least one first transistor among the plurality of first transistors and the plurality of second transistors in a transmitting mode, and generate a second Off voltage to turn off at least one second transistor among the plurality of first transistors and the plurality of second transistors in a receiving mode, wherein second Off voltage may be greater than the first Off voltage.

The first Off voltage may be a negative (−) voltage, and the second Off voltage is 0 V.

The plurality of first transistors of the first switch may include a first series transistor and a first shunt transistor, and the plurality of second transistors of the second switch comprise a second series transistor and a second shunt transistor, and the first Off voltage is applied to the first shunt transistor and the second series transistor in the transmitting mode, and the second Off voltage may be applied to the second shunt transistor and the first series transistor in the receiving mode.

In the transmitting mode, the first series transistor may be turned on, the second shunt transistor is turned on, and a first RF path may be formed between the transmitting port and the antenna port, and in the receiving mode, the second series transistor may be turned on, the first shunt transistor is turned on, and a second RF path is formed between the antenna port and the receiving port.

The switch control circuit may include an Off voltage generator configured to generate the first Off voltage in the transmitting mode, and configured to generate the second Off voltage in the receiving mode; and a buffer configured to receive the first Off voltage from the Off voltage generator and apply the received first Off voltage to the at least one first transistor in the transmitting mode, and configured to receive the second Off voltage from the Off voltage generator and apply the second Off voltage to the at least one second transistor in the receiving mode.

The switch control circuit may include a negative voltage generating circuit configured to generate the first Off voltage that is a negative (−) voltage, the negative voltage generating circuit may include an oscillator configured to generate clock signals, a charge pump configured to perform a charge pump operation corresponding to the generated clock signals and output the first Off voltage, and a voltage to current converter configured to generate a first current corresponding to the first Off voltage, wherein the first current is input to the oscillator, and a frequency of the clock signals is changed based on the first current.

The first current may increase when the first Off voltage rises, and the frequency of the clock signals may increase when the first current increases.

The voltage to current converter may include a first transistor configured to output a second current corresponding to the first Off voltage, and a first current mirror configured to output a third current corresponding to the second current, and wherein the third current is the first current.

The voltage to current converter may further include a first resistor including a first end connected to a power source voltage, a second resistor connected between a second end of the first resistor and the first Off voltage, and a control terminal of the first transistor of the voltage to current converter may be connected to the second end of the first resistor, and the second current is output to a first terminal of the first transistor.

A method includes generating control voltages to control a plurality of first transistors to set a first radio frequency (RF) path formed between a first port and a second port, and to control a plurality of second transistors to set a second RF path formed between the first port and a third port; applying a first Off voltage from among the generated control voltages to at least one first transistor from among the plurality of first transistors and the plurality of second transistors when the first RF path is set; and applying a second Off voltage from among the generated control voltages to at least one second transistor from among the plurality of first transistors and the plurality of second transistors when the second RF path is set, wherein the second Off voltage may be greater than the first Off voltage.

The first Off voltage may be a negative (−) voltage, and the second Off voltage is 0 V.

The plurality of first transistors may include a first series transistor and a first shunt transistor, the plurality of second transistors include a second series transistor and a second shunt transistor, the at least one first transistor comprises the first shunt transistor, and the at least one second transistor comprises the second shunt transistor.

The first series transistor may be configured to turn on and the second shunt transistor may be configured to turn on when the first RF path is set, and the second series transistor may be configured to turn on and the first shunt transistor may be configured to turn on when the second RF path is set.

The first port may be an antenna port, the second port may be a transmitting port, and the third port may be a receiving port.

The first RF path may be implemented in a transmitting mode, and the second RF path may be implemented in a receiving mode.

In a general aspect, a radio frequency (RF) switch circuit includes a first switch, comprising at least one series transistor and at least one shunt transistor; a second switch, comprising at least one series transistor and at least one shunt transistor; and a switch control circuit, configured to control a reception mode and a transmission mode of the first switch and the second switch, wherein, in the transmitting mode, the switch control circuit is configured to set a first shunt off voltage of the first switch and a first series off voltage of the second switch to a negative (−) voltage, and wherein in the reception mode, the switch control circuit is configured to set a second series off voltage of the first switch and a second shunt off voltage of the second switch to zero (0) volts.

In the transmitting mode, the negative (−) voltage may turn off a shunt transistor of the first switch, and turns off a series transistor of the second switch.

In the receiving mode, the zero (0) volts may turn off a series transistor of the first switch, and turns off a shunt transistor of the second switch.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
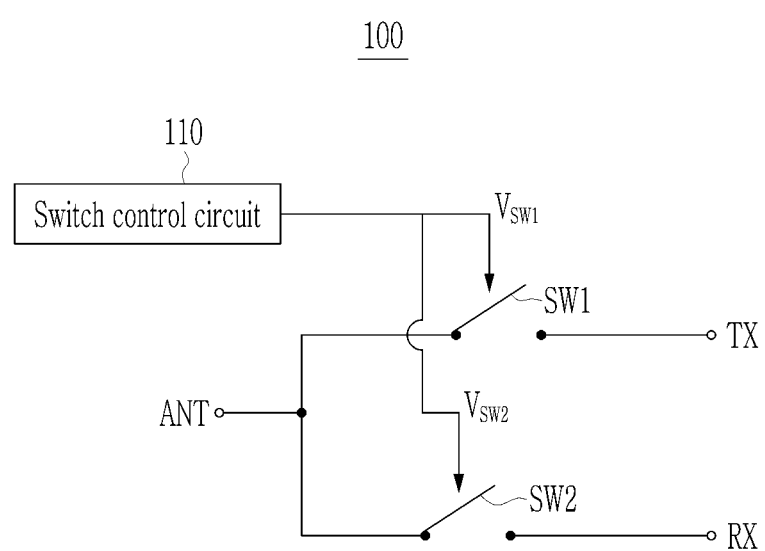
FIG. 1 illustrates an example RF switch circuit, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s).

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Hereinafter, examples will be described in detail with reference to the accompanying drawings, and like reference numerals in the drawings refer to like elements throughout.

The RF signal may have a form of Wi-Fi (IEEE 802.11 family and others), WiMAX (IEEE 802.16 family and others), IEEE 802.20, long term evolution (LTE), Evolution-Data Optimized (Ev-DO), high-speed packet access plus (HSPA+), high-speed downlink packet access plus (HSDPA+), high-speed uplink packet access plus (HSUPA+), Enhanced Data GSM Evolution (EDGE), Global System for Mobile communication (GSM), Global Positioning System (GPS), General Packet Radio Service (GPRS), Code Division Multiple Access (CDMA), Time Division Multiple Access (TDMA), digital enhanced cordless communication (DECT), Bluetooth, third generation (3G), fourth generation (4G), fifth generation (5G), and other arbitrary wired and wireless protocols, and it is not limited thereto.

FIG. 1 illustrates an example RF switch circuit 100, in accordance with one or more embodiments.

As illustrated in FIG. 1, the example RF switch circuit 100 may include a first switch (SW1), a second switch (SW2), and a switch control circuit 110.

The first switch (SW1) may be connected between a transmitting port (TX) and an antenna port (ANT), and may switch an RF path formed between the transmitting port (TX) and the antenna port (ANT). In the transmitting mode, the first switch (SW1) may be turned on, and the transmitting port (TX) may be connected to the antenna port (ANT).

The second switch (SW2) may be connected between the antenna port (ANT) and the receiving port (RX), and may switch the RF path formed between the antenna port (ANT) and the receiving port (RX). In the receiving mode, the second switch (SW2) may be turned on, and the antenna port (ANT) may be connected to the receiving port (RX).

The switch control circuit 110 may generate a first switch control voltage ($V_{SW1}$) to control the first switch (SW1), and may apply the first switch control voltage ($V_{SW1}$) to the first switch (SW1). The switch control circuit 110 may generate a second switch control voltage ($V_{SW2}$) to control the second switch (SW2), and may apply the second switch control voltage ($V_{SW2}$) to the second switch (SW2). The switch control circuit 110 may set different Off voltages of transistors implemented in the first and second switches (SW1 and SW2) according to the receiving mode and the transmitting mode. The switch control circuit 110 may set the Off voltage of the transistor in the receiving mode to be greater than the Off voltage of the transistor in the transmitting mode. This will be described in detail in a later portion of the present specification.

An antenna may be connected to the antenna port (ANT). A power amplifier (PA) included in the transmitting end may be connected to the transmitting port (TX), and a low noise amplifier (LNA) included in the receiving end may be connected to the receiving port (RX).

Figure 2:
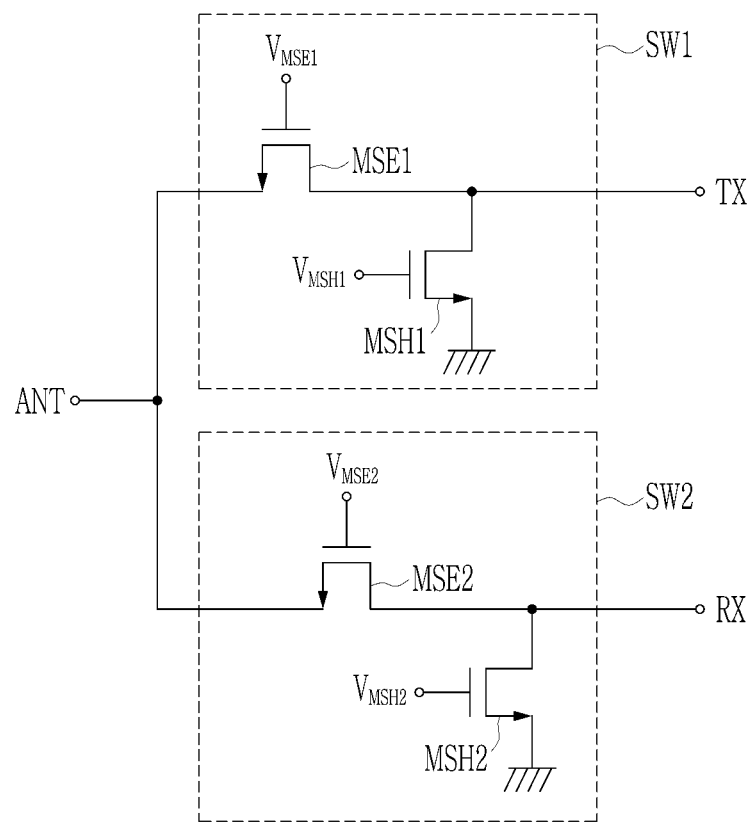
FIG. 2 illustrates a circuit diagram of a detailed configuration of first and second switches of FIG. 1.

FIG. 2 illustrates an example circuit diagram of a detailed configuration of the first and second switches (SW1 and SW2) of FIG. 1.

As illustrated in FIG. 2, the first and second switches (SW1 and SW2) may respectively include a series transistor and a shunt transistor. Specifically, the first switch (SW1) may include a first series transistor (MSE1) and a first shunt transistor (MSH1), and the second switch (SW2) may include a second series transistor (MSE2) and a second shunt transistor (MSH2). The respective transistors (MSE1, MSH1, MSE2, and MSH2) illustrated in FIG. 2 may be realized with various types of transistors such as, but not limited to, field-effect transistors (FET) and bipolar transistors which perform a switching function. The transistors (MSE1, MSH1, MSE2, and MSH2) are illustrated to be an n-type in FIG. 2, and they may be substituted with a p-type. For better understanding and ease of description, the transistors (MSE1, MSH1, MSE2, and MSH2) are assumed to be FETs. However, this is only an example, and other transistors may be implemented.

Referring again to FIG. 2, a source of the first series transistor (MSE1) may be connected to the antenna port (ANT), and a drain of the first series transistor (MSE1) may be connected to the transmitting port (TX). A drain of the first shunt transistor (MSH1) may be connected to the drain of the first series transistor (MSE1) and to the transmitting port (TX), and a source of the first shunt transistor (MSH1) may be grounded. A first series control voltage ($V_{MSE1}$) may be applied to a gate of the first series transistor (MSE1), and a first shunt control voltage ($V_{MSH1}$) may be applied to a gate of the first shunt transistor (MSH1). The first series control voltage ($V_{MSE1}$) and the first shunt control voltage ($V_{MSH1}$) may have a logically reverse relationship from each other. Accordingly, when the first series transistor (MSE1) is turned on, the first shunt transistor (MSH1) is turned off, and when the first series transistor (MSE1) is turned off, the first shunt transistor (MSH1) is turned on. When the first switch (SW1) is operated in an On-state, the first series transistor (MSE1) may be turned on and the first shunt transistor (MSH1) may be turned off. When the first switch (SW1) is operated in an Off-state, the first series transistor (MSE1) may be turned off and the first shunt transistor (MSH1) may be turned on.

Referring again to FIG. 2, a source of the second series transistor (MSE2) may be connected to the antenna port (ANT), and a drain of the second series transistor (MSE2) may be connected to the receiving port (RX). A drain of the second shunt transistor (MSH2) may be connected to the drain of the second series transistor (MSE2) and to the receiving port (RX), and a source of the second shunt transistor (MSH2) may be grounded. A second series control voltage ($V_{MSE2}$) may be applied to the gate of the second series transistor (MSE2), and a second shunt control voltage ($V_{MSH2}$) may be applied to the gate of the second shunt transistor (MSH2). The second series control voltage ($V_{MSE2}$) and the second shunt control voltage ($V_{MSH2}$) may have a logically reverse relationship from each other. Accordingly, when the second series transistor (MSE2) is turned on, the second shunt transistor (MSH2) may be turned off, and when the second series transistor (MSE2) is turned off, the second shunt transistor (MSH2) may be turned on. When the second switch (SW2) is operated in an On-state, the second series transistor (MSE2) may be turned on and the second shunt transistor (MSH2) may be turned off. When the second switch (SW2) is operated in an Off-state, the second series transistor (MSE2) may be turned off and the second shunt transistor (MSH2) may be turned on.

The switch control circuit (or off voltage selector) 110 may generate a first series control voltage ($V_{MSE1}$) and a first shunt control voltage ($V_{MSH1}$) as the first switch control voltage ($V_{SW1}$). That is, the first switch control voltage ($V_{SW1}$) may include the first series control voltage ($V_{MSE1}$) and the first shunt control voltage ($V_{MSH1}$) The first series control voltage ($V_{MSE1}$) may include a first series On voltage ($V_{MSE1\_ON}$) to turn on the first series transistor (MSE1) and a first series Off voltage ($V_{MSE1\_OFF}$) to turn off the first series transistor (MSE1). The first shunt control voltage ($V_{MSH1}$) may include a first shunt On voltage ($V_{MSH1\_ON}$) to turn on the first shunt transistor (MSH1) and a first shunt Off voltage ($V_{MSH1\_OFF}$) to turn off the first shunt transistor (MSH1).

The switch control circuit 110 may generate a second series control voltage ($V_{MSE2}$) and a second shunt control voltage ($V_{MSH2}$) as the second switch control voltage ($V_{SW2}$). That is, the second switch control voltage ($V_{SW2}$) may include the second series control voltage ($V_{MSE2}$) and the second shunt control voltage ($V_{MSH2}$). The second series control voltage ($V_{MSE2}$) may include a second series On voltage ($V_{MSE2\_ON}$) to turn on the second series transistor (MSE2) and a second series Off voltage ($V_{MSE2\_OFF}$) to turn off the second series transistor (MSE2). The second shunt control voltage ($V_{MSH2}$) may include a second shunt On voltage ($V_{MSH2\_ON}$) to turn on the second shunt transistor (MSH2) and a second shunt Off voltage ($V_{MSH2\_OFF}$) to turn off the second shunt transistor (MSH2).

In an example, the first series transistor (MSE1), the first shunt transistor (MSH1), the second series transistor (MSE2), and the second shunt transistor (MSH2) may be respectively implemented with a transistor in FIG. 2. However, this is only an example, and the first series transistor (MSE1), the first shunt transistor (MSH1) may be implemented with a plurality of transistors (for example, a plurality of transistors that are stacked).

A method of operating an example RF switch circuit 100, in accordance with one or more embodiments, will now be described with reference to FIG. 3A and FIG. 3B.

Figure 3A:
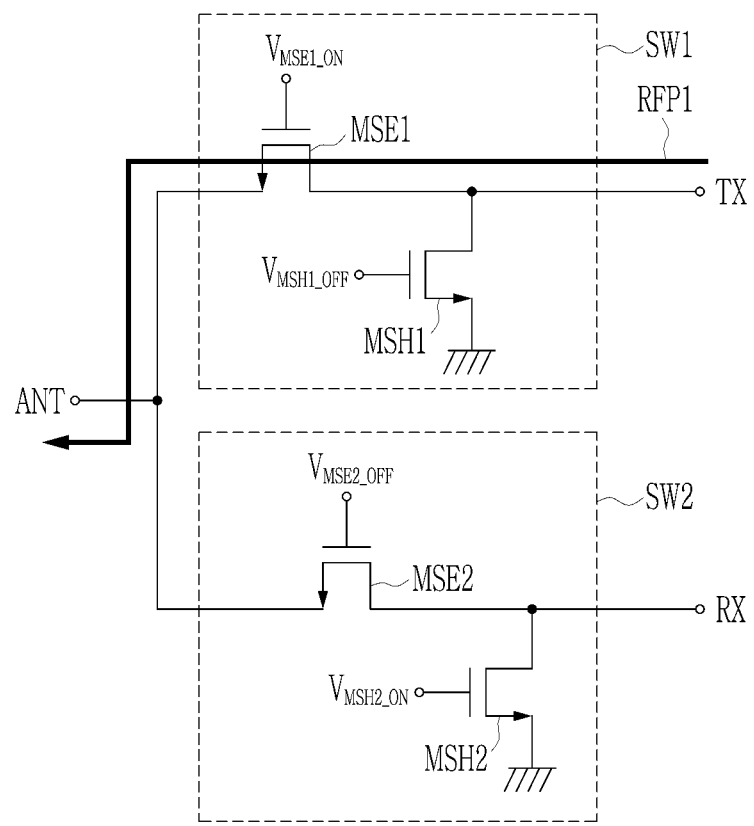
FIG. 3A illustrates an operation state of an example RF switch circuit in a transmitting mode, in accordance with one or more embodiments.

FIG. 3A illustrates an operation state of an example RF switch circuit 100 in a transmitting mode.

Referring to FIG. 3A, in the transmitting mode, the first series transistor (MSE1) is turned on, and the first shunt transistor (MSH1) is turned off. The second series transistor (MSE2) is turned off, and the second shunt transistor (MSH2) is turned on, accordingly, any residual signals may be transmitted to the ground. Accordingly, a transmitting RF path (RFP 1) may be formed through the transmitting port (TX), the first series transistor (MSE1), and the antenna port (ANT). A first series On voltage ($V_{MSE1\_ON}$) may be applied to the gate of the first series transistor (MSE1), and a first shunt Off voltage ($V_{MSH1\_OFF}$) may be applied to the gate of the first shunt transistor (MSH1). A second series Off voltage ($V_{MSE2\_OFF}$) may be applied to the gate of the second series transistor (MSE2), and a second shunt On voltage ($V_{MSH2\_ON}$) may be applied to the gate of the second shunt transistor (MSH2). The first series On voltage ($V_{MSE1\_ON}$) and the second shunt On voltage ($V_{MSH1\_ON}$) may be positive (+) voltages, and the first shunt Off voltage ($V_{MSH1\_OFF}$) and the second series Off voltage ($V_{MSE2\_OFF}$) may be negative (−) voltages.

In the transmitting mode, the transmitting RF signal may be large. Accordingly, the transistor Off voltage (i.e., the first shunt Off voltage ($V_{MSH1\_OFF}$) and the second series Off voltage ($V_{MSE2\_OFF}$)) may be set to be negative (−) voltages. In an example, when the first shunt Off voltage ($V_{MSH1\_OFF}$) is not a negative (−) voltage (e.g., 0 V), the first shunt transistor (MSH1) may not be in an Off state but in an On state. Since the transmitting RF signal may have a large RF swing, the voltage at the gate of the first shunt transistor (MSH1) may increase. When the first shunt Off voltage ($V_{MSH1\_OFF}$) is 0 V, the first shunt transistor (MSH1) may not be operated in a cutoff region and may be changed to a triode region. To prevent this, the first shunt Off voltage ($V_{MSH1\_OFF}$) may be set to be a negative (−) voltage. The transmitting RF signal may be a large signal of about 30 dBm, so the transmitting RF signal may be less influenced by noise generated by a negative (−) transistor Off voltage.

Figure 3B:
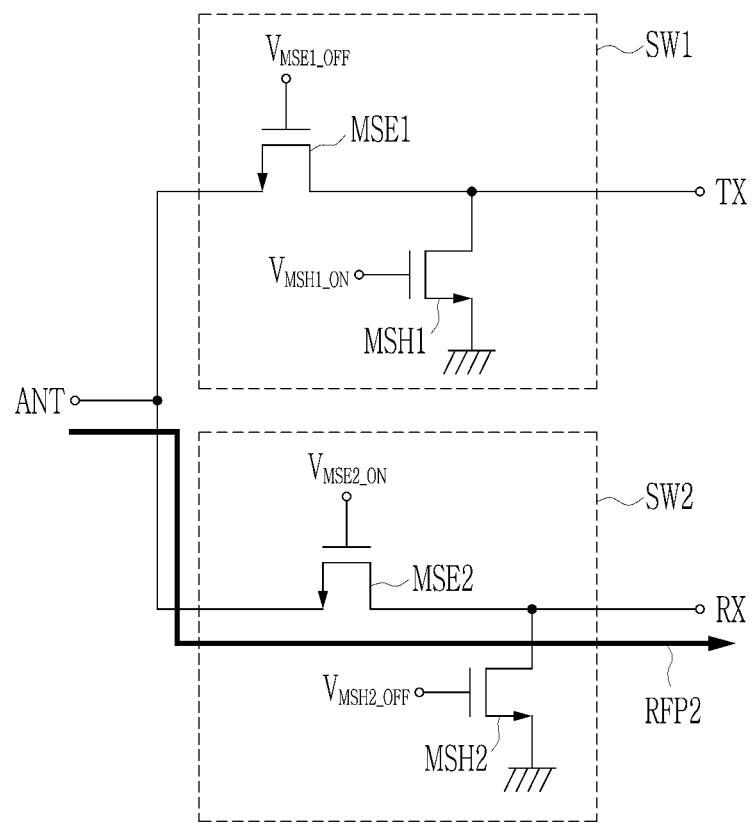
FIG. 3B illustrates an operation state of an example RF switch circuit in a receiving mode, in accordance with one or more embodiments.

FIG. 3B illustrates an operation state of an example RF switch circuit 100 in a receiving mode.

Referring to FIG. 3B, in the receiving mode, the first series transistor (MSE1) is turned off, and the first shunt transistor (MSH1) is turned on. The second series transistor (MSE2) is turned on, and the second shunt transistor (MSH2) is turned off. Accordingly, a receiving RF path (RFP 2) may be formed through the antenna port, the second series transistor (MSE2), and the receiving port (RX). A first series Off voltage ($V_{MSE1\_OFF}$) may be applied to the gate of the first series transistor (MSE1), and a first shunt On voltage ($V_{MSH1\_ON}$) may be applied to the gate of the first shunt transistor (MSH1). A second series On voltage ($V_{MSE2\_ON}$) may be applied to the gate of the second series transistor (MSE2), and a second shunt Off voltage ($V_{MSH2\_OFF}$) may be applied to the gate of the second shunt transistor (MSH2). The first shunt On voltage ($V_{MSH1\_ON}$) and the second series On voltage ($V_{MSE2\_ON}$) may be positive (+) voltages, and at least one of the first series Off voltage ($V_{MSE1\_OFF}$) and the second shunt Off voltage ($V_{MSH2\_OFF}$) may be greater than at least one of the first shunt Off voltage ($V_{MSH1\_OFF}$) and the second series Off voltage ($V_{MSE2\_OFF}$) In an example, the second shunt Off voltage ($V_{MSH2\_OFF}$) and the first shunt Off voltage ($V_{MSH1\_OFF}$) may satisfy Equation 1 below.

$$V_{MSH2\_OFF} > V_{MSH1\_OFF} \qquad \text{Equation 1:}$$

In other words, the transistor Off voltage (the first series Off voltage ($V_{MSE1\_OFF}$) and the second shunt Off voltage ($V_{MSH2\_OFF}$)) in the receiving mode may be set to be higher than the transistor Off voltage (the first shunt Off voltage ($V_{MSH1\_OFF}$) and the second series Off voltage ($V_{MSE2\_OFF}$)) in the transmitting mode. Accordingly, the receiving RF signal may be less influenced by the first series Off voltage ($V_{MSE1\_OFF}$) and the second shunt Off voltage ($V_{MSH2\_OFF}$). The receiving RF signal may be very much weaker than the transmitting RF signal, so the receiving RF signal is sensitive to noise caused by the transistor Off voltage. In an example, the receiving RF signal may be a small signal of about 0 dBm, and the receiving RF signal may be influenced by the noise caused by a large negative (−) voltage. Hence, at least one of the first series Off voltage ($V_{MSE1\_OFF}$) and the second shunt Off voltage ($V_{MSH2\_OFF}$) may be set to be higher than at least one of the first shunt Off voltage ($V_{MSH1\_OFF}$) and the second series Off voltage ($V_{MSE2\_OFF}$).

In an example, the first series Off voltage ($V_{MSE1\_OFF}$) and the second shunt Off voltage ($V_{MSH2\_OFF}$) may be 0 V, and the first shunt Off voltage ($V_{MSH1\_OFF}$) and the second series Off voltage ($V_{MSE2\_OFF}$) may be −2.5 V. In another example, the first series Off voltage ($V_{MSE1\_OFF}$) and the second shunt Off voltage ($V_{MSH2\_OFF}$) may be negative (−) voltages that are higher than the first shunt Off voltage ($V_{MSH1\_OFF}$) and the second series Off voltage ($V_{MSE2\_OFF}$).

Figure 4:
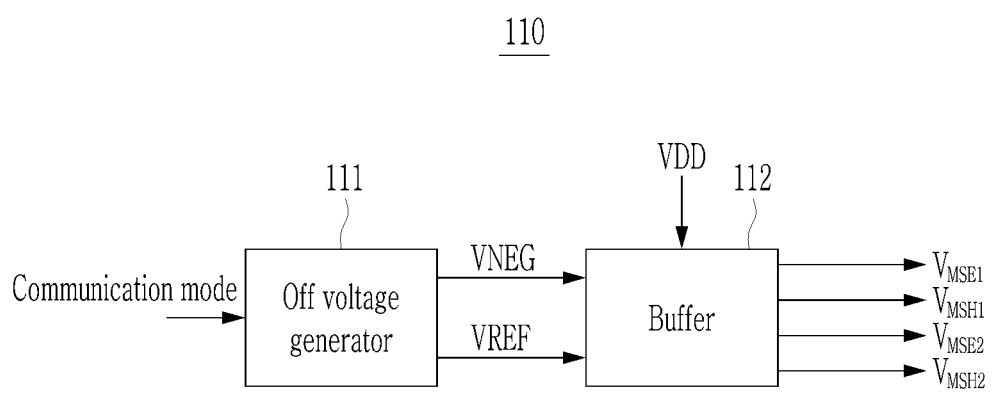
FIG. 4 illustrates an example switch control circuit, in accordance with one or more embodiments.

FIG. 4 illustrates an example switch control circuit 110, in accordance with one or more embodiments.

As illustrated in FIG. 4, the switch control circuit 110 may include an Off voltage generator 111 and a buffer 112.

The Off voltage generator 111 may receive a communication mode from an external source, and may generate an Off voltage based on the received communication mode. When the communication mode is the transmitting mode, the Off voltage generator 111 may generate the first Off voltage (VNEG). When the communication mode is the receiving mode, the Off voltage generator 111 may generate the second Off voltage (VREF). In an example, the second Off voltage (VREF) may be higher than the first Off voltage (VNEG). For example, the first Off voltage (VNEG) may be a negative (−) voltage, and the second Off voltage (VREF) may be 0 V. A method for the Off voltage generator 111 to generate the Off voltage is known to a person of ordinary skill and will be omitted.

The buffer 112 may receive a power source voltage (VDD) from an external source and generate a transistor On voltage based on the power source voltage (VDD). The transistor On voltage may include the first series On voltage ($V_{MSE1\_ON}$), the first shunt On voltage ($V_{MSH1\_ON}$), the second series On voltage ($V_{MSE2\_ON}$), and the second shunt On voltage ($V_{MSH2\_ON}$) described with reference to FIG. 2. In an example, the first series On voltage ($V_{MSE1\_ON}$), the first shunt On voltage ($V_{MSH1\_ON}$), the second series On voltage ($V_{MSE2\_ON}$), and the second shunt On voltage ($V_{MSH2\_ON}$) may be power source voltages (VDD). The power source voltage (VDD) turns on the transistors and may be a positive (+) voltage.

The buffer 112 may receive the Off voltage (the first Off voltage (VNEG) or the second Off voltage (VREF)) from the Off voltage generator 111, and may generate the transistor Off voltage based on the Off voltage. The transistor Off voltage may include the first series Off voltage ($V_{MSE1\_OFF}$), the first shunt Off voltage ($V_{MSH1\_OFF}$), the second series Off voltage ($V_{MSE2\_OFF}$), and the second shunt Off voltage ($V_{MSH2\_OFF}$).

When the first Off voltage (VNEG) is input from the Off voltage generator 111, the buffer 112 may generate the first shunt Off voltage ($V_{MSH1\_OFF}$) and the second series Off voltage ($V_{MSE2\_OFF}$) based on the first Off voltage (VNEG). In an example, the first shunt Off voltage ($V_{MSH1\_OFF}$) and the second series Off voltage ($V_{MSE2\_OFF}$) may be the first Off voltage (VNEG).

When the second Off voltage (VREF) is input from the Off voltage generator 111, the buffer 112 may generate the first series Off voltage ($V_{MSE1\_OFF}$) and the second shunt Off voltage ($V_{MSH2\_OFF}$) based on the second Off voltage (VREF). In an example, the first series Off voltage ($V_{MSE1\_OFF}$) and the second shunt Off voltage ($V_{MSH2\_OFF}$) may be the second Off voltage (VREF).

A negative (−) voltage may be used as the transistor Off voltage as described above, and a circuit and a method to generate a negative (−) voltage will now be described with reference to FIG. 5 to FIG. 8.

Figure 5:
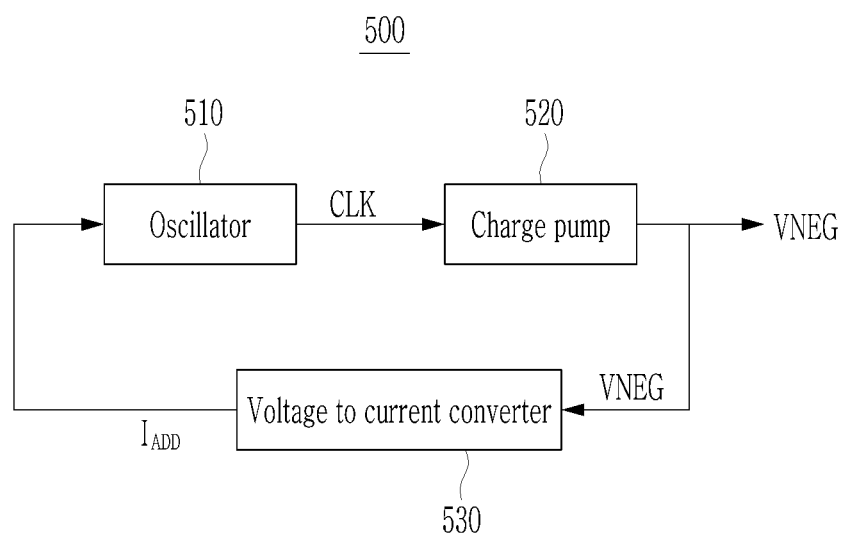
FIG. 5 illustrates an example negative voltage generating circuit, in accordance with one or more embodiments.

FIG. 5 illustrates an example negative voltage generating circuit 500, in accordance with one or more embodiments.

As illustrated in FIG. 5, the negative voltage generating circuit 500 may include an oscillator 510, a charge pump 520, and a voltage to current converter 530. The negative voltage generating circuit 500 may be included in the switch control circuit 110. In an example, the negative voltage generating circuit 500 may be included in the Off voltage generator 111 of the switch control circuit 110.

Figure 6:
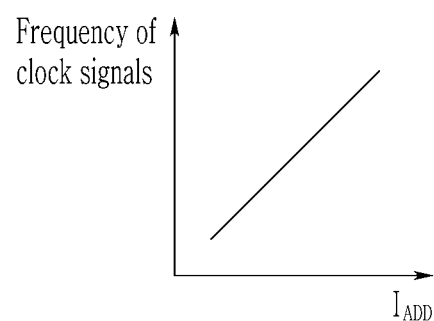
FIG. 6 illustrates a graph of a relationship between an additional current and a frequency of clock signals, in accordance with one or more embodiments.

The oscillator 510 may generate clock signals (CLK) with a predetermined frequency and output the same. The frequency of the clock signal (CLK) may be controlled by an additional current ($I_{ADD}$) applied by the voltage to current converter 530. FIG. 6 illustrates a graph of a relationship between an additional current ($I_{ADD}$) and a frequency of clock signal, in accordance with one or more embodiments. As illustrated in FIG. 6, when the additional current ($I_{ADD}$) increases, the frequency of the clock signal (CLK) also increases. The method for the oscillator 510 to generate the clock signals and control the frequency by the additional current is known to a person of ordinary skill and will be omitted.

The charge pump 520 may receive the clock signals (CLK) from the oscillator 510, and may operate based on the clock signals (CLK), thereby generating the first Off voltage (VNEG). When the frequency of the clock signal increases, the charge pump 520 may quickly perform a charge pump operation, so the first Off voltage (NEG) of the charge pump 520 may be quickly saturated to a desired voltage. The charge pump 520 may include a capacitor and a transistor to perform the charge pumping operation, which is known to a person of ordinary skill and will be omitted. The negative voltage finally output by the negative voltage generating circuit 500 is shown to be the first Off voltage (VNEG) in FIG. 5, and another negative voltage may be output.

The voltage to current converter 530 may receive the first Off voltage (VNEG) output by the charge pump 520, and may generate an additional current ($I_{ADD}$) corresponding to the first Off voltage (VNEG). The additional current ($I_{ADD}$) may be input to the oscillator 510, and the oscillator 510 may change the frequency of the clock signal (CLK) corresponding to the additional current ($I_{ADD}$).

Figure 7:
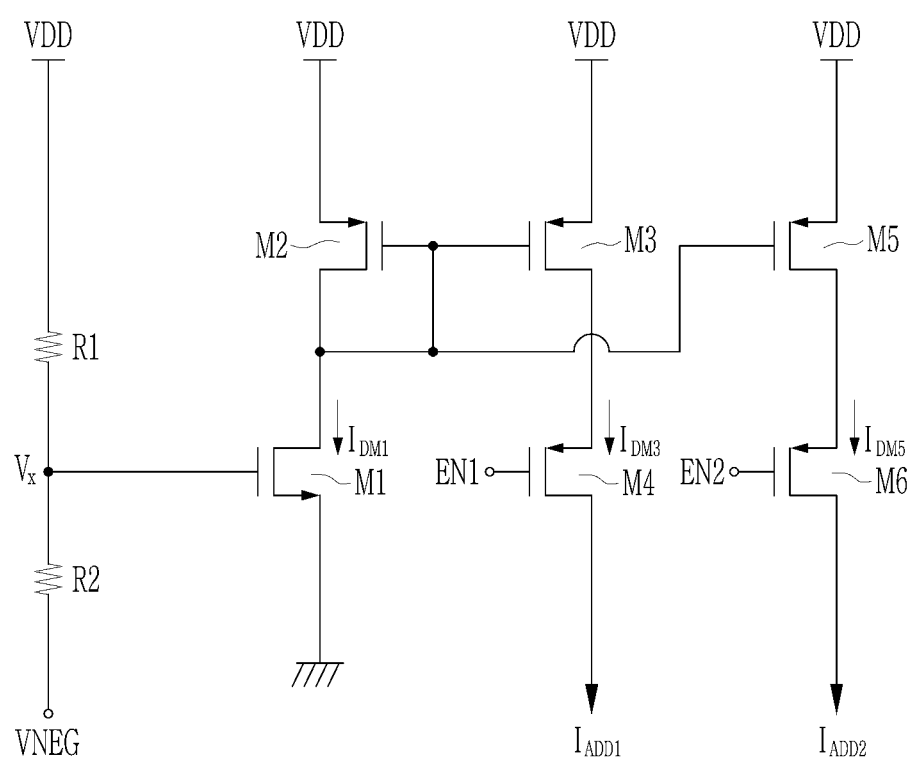
FIG. 7 illustrates a circuit diagram of an internal configuration of a voltage to current converter, in accordance with one or more embodiments.

FIG. 7 illustrates a circuit diagram of an internal configuration of a voltage to current converter 530, in accordance with one or more embodiments.

The voltage to current converter 530 may include a resistor (R1), a resistor (R2), a transistor (M1), a transistor (M2), a transistor (M3), a transistor (M4), a transistor (M5) and a transistor (M6). The transistors (M1, M2, M3, M4, M5, and M6) illustrated in FIG. 7 may be implemented with various types of transistors such as, but not limited to, electric field-effect transistors (FET) or bipolar transistors.

Referring to FIG. 7, the transistor (M1) is illustrated as being an n-type transistor and the transistors (M2, M3, M4, M5, and M6) are illustrated as being a p-type transistor. However, these are only examples, and the respective types of transistors are changeable. For better understanding and ease of description, the transistors (M1, M2, M3, M4, M5, and M6) are assumed to be FETs, and they may be substituted with other types of transistors.

A first end of the resistor (R1) may be connected to the power source voltage (VDD), and a first end of the resistor (R2) may be connected to a second end of the resistor (R1). A second end of the resistor (R2) may be connected to the first Off voltage (VNEG). A voltage at a node between the resistor (R1) and the resistor (R2) will be marked as $V_X$. The voltage ($V_X$) may be variable corresponding to the first Off voltage (VNEG). When the first Off voltage (VNEG) rises to about 0 V, the voltage ($V_X$) may also rise. When the first Off voltage (VNEG) falls to a negative voltage, the voltage ($V_X$) may also fall.

A gate of the transistor (M1) may be connected to the node between the resistor (R1) and the resistor (R2), and may receive the voltage ($V_X$). A source of the transistor (M1) may be grounded, and a drain of the transistor (M1) may be connected to the drain of the transistor (M2). A drain current ($I_{DM1}$) of the transistor (M1) may be variable based on a gate voltage of the transistor (M1), that is the voltage ($V_X$). That is, when the voltage ($V_X$) rises, the drain current ($I_{DM1}$) of the transistor (M1) may also increase.

A gate and a drain of the transistor (M2) may be connected to each other, and a source of the transistor (M2) may be connected to the power source voltage (VDD). A gate of the transistor (M3) may be connected to the gate of the transistor (M2), and a source of the transistor (M3) may be connected to the power source voltage (VDD). That is, the transistor (M2) and the transistor (M3) may configure a current mirror structure. Accordingly, a drain current ($I_{DM3}$) of the transistor (M3) may be proportional to a drain current ($I_{DM1}$) of the transistor (M1). A gate of the transistor (M4) may be connected to a control signal (EN1), and a source of the transistor (M4) may be connected to the drain of the transistor (M3). The transistor (M4) may be operated of controlled based on an external control signal (EN1), and a first additional current ($I_{ADD1}$) may be output from a drain of the transistor (M4). When there are no transistors (M5 and M6), the first additional current ($I_{ADD1}$) may be the additional current ($I_{ADD}$) of FIG. 5.

Additionally, the voltage to current converter 530 may further include the transistor (M5) and the transistor (M6) so as to generate a second additional current ($I_{ADD2}$) A gate of the transistor (M5) may be connected to the gate of the transistor (M2) and a gate of transistor (M3), and a source of the transistor (M5) may be connected to the power source voltage (VDD). That is, the transistor (M2) and the transistor (M5) may configure a current mirror structure. Accordingly, a drain current ($I_{DM1}$) of the transistor (M5) may be proportional to the drain current ($I_{DM1}$) of the transistor (M1). A gate of the transistor (M6) may be connected to a control signal (EN2), and a source of the transistor (M6) may be connected to the drain of the transistor (M5). The transistor (M6) may be operated or controlled based on an external control signal (EN2), and a second additional current ($I_{ADD12}$) may be output from a drain of the transistor (M6). When there are the transistors (M5 and M6), a sum of the first additional current ($I_{ADD1}$) and the second additional current ($I_{ADD2}$) may be the additional current ($I_{ADD}$) of FIG. 5. Referring to FIG. 7, transistors with the same structure as the transistor (M5) and the transistor (M6) may be added, and a much greater additional current may be generated.

Figure 8:
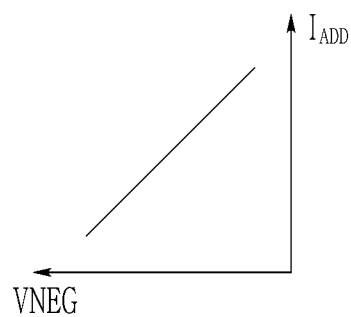
FIG. 8 illustrates a graph of a relationship between an additional current and a first Off voltage, in accordance with one or more embodiments.

FIG. 8 illustrates a graph of a relationship between an additional current ($I_{ADD}$) and a first Off voltage (VNEG), in accordance with one or more embodiments.

When the first Off voltage (VNEG) rises to around 0 V, the voltage ($V_X$) of FIG. 7 rises. As the voltage ($V_X$) rises, the drain current ($I_{DM1}$) of the transistor (M1) also increases, and the first additional current ($I_{ADD1}$) and the second additional current ($I_{ADD2}$) also increase. That is, as the first Off voltage rises to around 0 V, the additional current ($I_{ADD}$) also increases.

When the first Off voltage (VNEG) falls to a negative (−) voltage, the voltage ($V_X$) in FIG. 7 also falls. As the voltage ($V_X$) falls, the drain current ($I_{DM1}$) of the transistor (M1) is reduced, and the first additional current ($I_{ADD1}$) and the second additional current ($I_{ADD2}$) are also reduced. That is, as the first Off voltage is gradually reduced to the negative (−) voltage, the additional current ($I_{ADD}$) is also reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency (RF) switch circuit, comprising:
a first switch disposed between a transmitting port and an antenna port, and comprising a plurality of first transistors;
a second switch disposed between the antenna port and a receiving port, and comprising a plurality of second transistors; and
a switch control circuit configured to:
generate control voltages to control the plurality of first transistors and the plurality of second transistors,
applying, in a transmitting mode, a first Off voltage from among the generated control voltages to turn off at least one first transistor among the plurality of first transistors, and turn off at least one first transistor among the plurality of second transistors, and
applying, in a receiving mode, a second Off voltage from among the generated control voltages to turn off at least one second transistor among the plurality of first transistors and turn off at least one second transistor among the plurality of second transistors,
wherein the second Off voltage is greater than the first Off voltage.

2. The RF switch circuit of claim 1, wherein the first Off voltage is a negative (−) voltage, and the second Off voltage is 0 V.

3. The RF switch circuit of claim 1, wherein:
the plurality of first transistors of the first switch comprise a first series transistor and a first shunt transistor, and the plurality of second transistors of the second switch comprise a second series transistor and a second shunt transistor, and
the first Off voltage is applied to the first shunt transistor and the second series transistor in the transmitting mode, and
the second Off voltage is applied to the second shunt transistor and the first series transistor in the receiving mode.

4. The RF switch circuit of claim 3, wherein:
in the transmitting mode, the first series transistor is turned on, the second shunt transistor is turned on, and a first RF path is formed between the transmitting port and the antenna port, and
in the receiving mode, the second series transistor is turned on, the first shunt transistor is turned on, and a second RF path is formed between the antenna port and the receiving port.

5. The RF switch circuit of claim 1, wherein:
the switch control circuit comprises:
an Off voltage generator configured to generate the first Off voltage in the transmitting mode, and configured to generate the second Off voltage in the receiving mode; and
a buffer configured to receive the first Off voltage from the Off voltage generator and apply the received first Off voltage to the at least one first transistor among the plurality of first transistors and the at least one first transistor among the plurality of second transistors in the transmitting mode, and configured to receive the second Off voltage from the Off voltage generator and apply the second Off voltage to the at least one second transistor among the plurality of first transistors and the at least one second transistor among the plurality of second transistors in the receiving mode.

6. The RF switch circuit of claim 1, wherein:
the switch control circuit comprises a negative voltage generating circuit configured to generate the first Off voltage that is a negative (−) voltage,
the negative voltage generating circuit comprises:
an oscillator configured to generate clock signals,
a charge pump configured to perform a charge pump operation corresponding to the generated clock signals and output the first Off voltage, and
a voltage to current converter configured to generate a first current corresponding to the first Off voltage,
wherein the first current is input to the oscillator, and a frequency of the clock signals is changed based on the first current.

7. The RF switch circuit of claim 6, wherein:
the first current increases when the first Off voltage rises, and
the frequency of the clock signals increases when the first current increases.

8. The RF switch circuit of claim 7, wherein:
the voltage to current converter comprises:
a first transistor configured to output a second current corresponding to the first Off voltage, and
a first current mirror configured to output a third current corresponding to the second current, and
wherein the third current is the first current.

9. The RF switch circuit of claim 8, wherein:
the voltage to current converter further comprises:
a first resistor comprising a first end connected to a power source voltage,
a second resistor connected between a second end of the first resistor and the first Off voltage, and
a control terminal of the first transistor of the voltage to current converter is connected to the second end of the first resistor, and the second current is output to a first terminal of the first transistor.

10. A method, comprising:
generating control voltages to control a plurality of first transistors to set a first radio frequency (RF) path formed between a first port and a second port, and to control a plurality of second transistors to set a second RF path formed between the first port and a third port;
applying a first Off voltage from among the generated control voltages to at least one first transistor from among the plurality of first transistors and the plurality of second transistors when the first RF path is set; and
applying a second Off voltage from among the generated control voltages to at least one second transistor from among the plurality of first transistors and the plurality of second transistors when the second RF path is set,
wherein the second Off voltage is greater than the first Off voltage.

11. The method of claim 10, wherein the first Off voltage is a negative (−) voltage, and the second Off voltage is 0 V.

12. The method of claim 10, wherein:
the plurality of first transistors comprise a first series transistor and a first shunt transistor, the plurality of second transistors comprise a second series transistor and a second shunt transistor,
the at least one first transistor comprises the first shunt transistor, and
the at least one second transistor comprises the second shunt transistor.

13. The method of claim 12, wherein:
the first series transistor is configured to turn on, and the second shunt transistor is configured to turn on when the first RF path is set, and
the second series transistor is configured to turn on and the first shunt transistor is configured to turn on when the second RF path is set.

14. The method of claim 10, wherein:
the first port is an antenna port, the second port is a transmitting port, and the third port is a receiving port.

15. The method of claim 14, wherein:
the first RF path is implemented in a transmitting mode, and
the second RF path is implemented in a receiving mode.

16. A radio frequency (RF) switch circuit, comprising:
a first switch, comprising at least one series transistor and at least one shunt transistor;
a second switch, comprising at least one series transistor and at least one shunt transistor; and
a switch control circuit, configured to control a reception mode and a transmission mode of the first switch and the second switch,
wherein, in the transmitting mode, the switch control circuit is configured to set a first shunt off voltage of the first switch and a first series off voltage of the second switch to a negative (−) voltage, and
wherein in the reception mode, the switch control circuit is configured to set a second series off voltage of the first switch and a second shunt off voltage of the second switch to zero (0) volts.

17. The RF switch circuit of claim 16, wherein in the transmitting mode, the negative (−) voltage turns off a shunt transistor of the first switch, and turns off a series transistor of the second switch.

18. The RF switch circuit of claim 16, wherein in the receiving mode, the zero (0) volts turns off a series transistor of the first switch, and turns off a shunt transistor of the second switch.

* * * * *